(12) United States Patent
Shao et al.

(10) Patent No.: US 12,513,893 B2
(45) Date of Patent: Dec. 30, 2025

(54) SEMICONDUCTOR STRUCTURE AND METHOD FOR FABRICATING SAME

(71) Applicant: CHANGXIN MEMORY TECHNOLOGIES, INC., Hefei (CN)

(72) Inventors: Guangsu Shao, Hefei (CN); Deyuan Xiao, Hefei (CN); Weiping Bai, Hefei (CN); Yunsong Qiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 637 days.

(21) Appl. No.: 17/893,192

(22) Filed: Aug. 23, 2022

(65) Prior Publication Data

US 2023/0328965 A1 Oct. 12, 2023

Related U.S. Application Data

(63) Continuation of application No. PCT/CN2022/099975, filed on Jun. 20, 2022.

(30) Foreign Application Priority Data

Mar. 25, 2022 (CN) .......................... 202210303198.5

(51) Int. Cl.
 *H10B 12/00* (2023.01)
(52) U.S. Cl.
 CPC .......... *H10B 12/33* (2023.02); *H10B 12/036* (2023.02); *H10B 12/05* (2023.02); *H10B 12/482* (2023.02); *H10B 12/488* (2023.02)
(58) Field of Classification Search
 CPC ...... H10B 12/33; H10B 12/036; H10B 12/05; H10B 12/482; H10B 12/488
 See application file for complete search history.

(56) References Cited

U.S. PATENT DOCUMENTS

| | | | |
|---|---|---|---|
| 2021/0202485 A1 | 7/2021 | Inaba | |
| 2022/0285350 A1* | 9/2022 | Okajima | H10D 30/6755 |
| 2023/0328955 A1* | 10/2023 | Su | H10B 12/038 |
| 2024/0098983 A1* | 3/2024 | Inukai | H10B 12/50 |
| 2025/0024659 A1* | 1/2025 | Shao | H10B 12/482 |

FOREIGN PATENT DOCUMENTS

EP 0315803 A2 5/1989

\* cited by examiner

*Primary Examiner* — David Vu
*Assistant Examiner* — Brandon C Fox
(74) *Attorney, Agent, or Firm* — Kilpatrick Townsend & Stockton LLP

(57) ABSTRACT

Embodiments provide a semiconductor structure and a method for fabricating a semiconductor structure, relating to the field of semiconductor technology. The semiconductor structure includes a substrate, a capacitor structure, a transistor structure, a bit line and a word line; and the substrate includes a semiconductor layer and a spacer. The capacitor structure is arranged on the substrate, and the spacer is positioned between the capacitor structure and at least a part of the semiconductor layer. The transistor structure and the word line are arranged on a side of the capacitor structure distant from the substrate, one of a source and a drain of the transistor structure is electrically connected to the capacitor structure, a gate of the transistor structure is electrically connected to the word line, and other one of the source and the drain of the transistor structure is electrically connected to the bit line.

18 Claims, 13 Drawing Sheets

SEMICONDUCTOR STRUCTURE AND METHOD FOR FABRICATING SAME

CROSS-REFERENCE TO RELATED APPLICATION

This application is a continuation of PCT/CN2022/099975, filed on Jun. 20, 2022, which claims priority to Chinese Patent Application No. 202210303198.5 titled "SEMICONDUCTOR STRUCTURE AND METHOD FOR FABRICATING SAME" and filed to the State Intellectual Property Office on Mar. 25, 2022, the entire contents of which are incorporated herein by reference.

TECHNICAL FIELD

The present disclosure relates to the field of semiconductor manufacturing technology, and more particularly, to a semiconductor structure and a method for fabricating a semiconductor structure.

BACKGROUND

As a semiconductor memory configured to randomly write and read data at high speed, Dynamic Random Access Memory (DRAM) is widely used in data memory devices or apparatuses.

The DRAM includes a substrate and a plurality of repeating memory cells arranged on the substrate, and each of the memory cells includes a capacitor and a transistor. In the DRAM having a transistor on capacitor (TOC) structure, the transistor is arranged above the capacitor, and the capacitor is in contact with the substrate.

However, in the above DRAM having the TOC structure, there is a problem of electrical leakage at a part where the capacitor is in contact with the substrate, which has a negative effect on storage performance of the DRAM.

SUMMARY

In a first aspect, the present disclosure provides a semiconductor structure, which includes a substrate, a capacitor structure, a transistor structure, a bit line and a word line: where the substrate includes a semiconductor layer and a spacer. The capacitor structure is arranged on the substrate, and the spacer is positioned between the capacitor structure and at least a part of the semiconductor layer. The transistor structure and the word line are arranged on a side of the capacitor structure distant from the substrate, one of a source and a drain of the transistor structure is electrically connected to the capacitor structure, a gate of the transistor structure is electrically connected to the word line, and other one of the source and the drain of the transistor structure is electrically connected to the bit line.

In a second aspect, the present disclosure provides a method for fabricating a semiconductor structure, which includes:
providing a substrate, the substrate comprising a semiconductor layer and a spacer; forming a capacitor structure, the capacitor structure being positioned on the substrate, and the spacer being positioned between the capacitor structure and at least a part of the semiconductor layer; forming a transistor structure, the transistor structure being positioned on the capacitor structure, and one of a source and a drain of the transistor structure being electrically connected to the capacitor structure; and forming a word line and a bit line, the word line being electrically connected to a gate of the transistor structure, and the bit line being electrically connected to other one of the source and the drain of the transistor structure.

DETAILED DESCRIPTION

Figure 1:
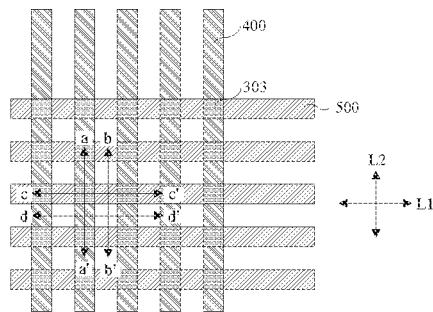
FIG. 1 is a top view of a semiconductor structure according to an embodiment of the present disclosure.
Figure 2:
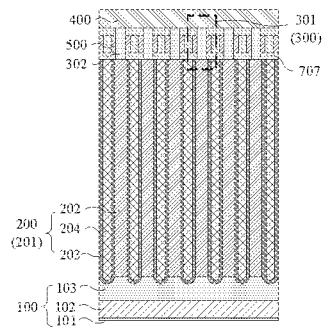
FIG. 2 is a sectional view of a semiconductor structure along an a-a' section according to an embodiment of the present disclosure.
Figure 3:
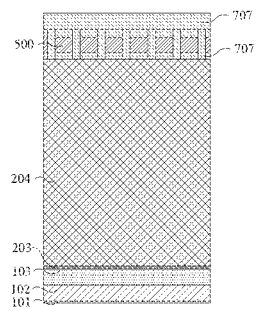
FIG. 3 is a sectional view of a semiconductor structure along a b-b' section according to an embodiment of the present disclosure.
Figure 4:
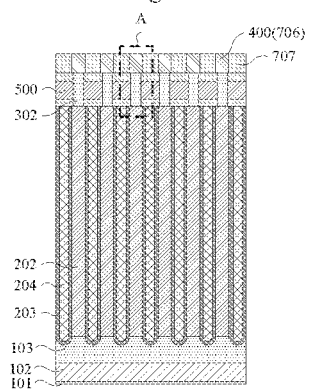
FIG. 4 is a sectional view of a semiconductor structure along a c-c' section according to an embodiment of the present disclosure.
Figure 5:
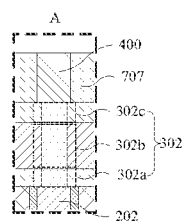
FIG. 5 is a partial enlarged view of part A in FIG. 4.
Figure 6:
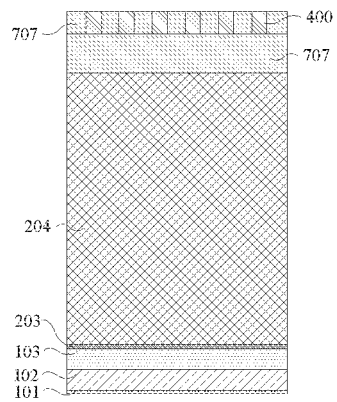
FIG. 6 is a sectional view of a semiconductor structure along a d-d' section according to an embodiment of the present disclosure.
Figure 7:
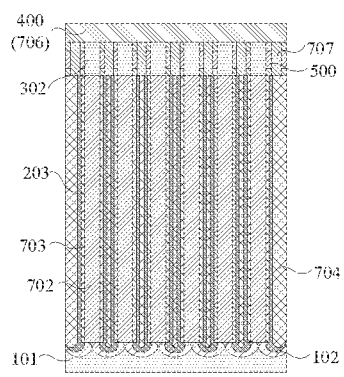
FIG. 7 is a sectional view of another semiconductor structure along the a-a' section according to an embodiment of the present disclosure.
Figure 8:
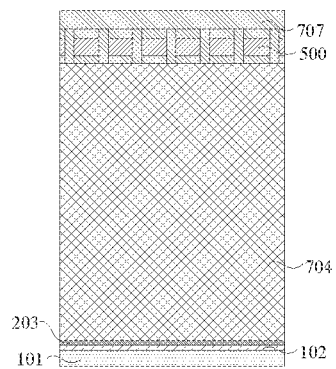
FIG. 8 is a sectional view of another semiconductor structure along the b-b' section according to an embodiment of the present disclosure.
Figure 9:
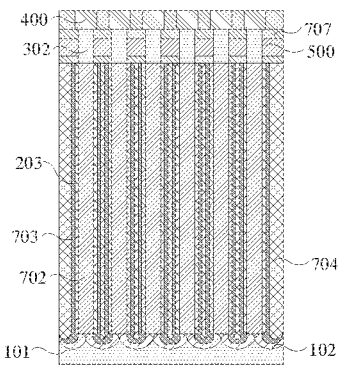
FIG. 9 is a sectional view of another semiconductor structure along the c-c' section according to an embodiment of the present disclosure.
Figure 10:
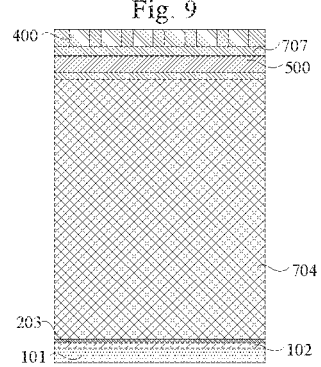
FIG. 10 is a sectional view of another semiconductor structure along the d-d' section according to an embodiment of the present disclosure.

In an actual research process, it is found that a Dynamic Random Access Memory (DRAM) includes a plurality of repeated memory cells, and each of the plurality of memory cells includes a capacitor and a transistor. In the DRAM having a Transistor on Capacitor (TOC) structure, the transistor of is arranged above the capacitor, and the capacitor is in contact with a substrate. The capacitor may include a top electrode plate, a bottom electrode plate, and an insulating layer arranged between the top electrode plate and the bottom electrode plate. The substrate is generally fabricated with a semiconductor structure. During normal use of the capacitor, the top electrode plate and the bottom electrode plate are electrically isolated due to existence of the insulating layer. However, because the capacitor is in contact with the substrate, a distance between the capacitor and the substrate is relatively short, such that electrical coupling is prone to occur, which has a negative effect on state of insulation between the top electrode plate and the bottom electrode plate, thereby causing a problem of electrical leakage. Therefore, during access of a DRAM signal, the problem of electrical leakage may occur in a part where the capacitor is in contact with the substrate due to negative effects on the substrate of the semiconductor, which not only reduces stability of the capacitor, but also causes damage to storage performance of the DRAM.

In view of this, embodiments of the present disclosure provide a semiconductor structure and a method for fabricating a semiconductor structure. By arranging a capacitor structure on the substrate and arranging a transistor structure on a side of the capacitor structure away from the substrate, difficulty of fabrication procedures may be effectively reduced for the transistor, making it easier for connection between the transistor structure and a word line or bit line, to better meet design requirements of circuit connection. One of a source and a drain of the transistor is connected to the capacitor structure, a gate of the transistor is connected to the word line, and the other one of the source and the drain is connected to the bit line, to achieve signal storage and reading functions of the semiconductor structure. By arranging a spacer in the substrate and arranging the spacer between the capacitor structure and at least a part of a semiconductor layer of the substrate, it is effectively avoided that the semiconductor layer acts on the capacitor structure to cause the problem of electrical leakage of the capacitor structure, which not only may ensure the stability of the capacitor structure, but also may improve the stability of signal storage and reading process of the semiconductor structure and optimize the performance of the semiconductor structure.

The embodiments of the present disclosure will be described in detail below with reference to the accompanying drawings. Referring to FIG. 1 to FIG. 10, the present disclosure provides a semiconductor structure.

In some embodiments, the semiconductor structure includes a substrate 100, a capacitor structure 200, a transistor structure 300, a bit line 400, and a word line 500: where the substrate 100 includes a semiconductor layer and a spacer 102. The capacitor structure 200 is arranged on the substrate 100, and the spacer 102 is positioned between the capacitor structure 200 and at least part of the semiconductor layer. The transistor structure 300 and the word line 500 are arranged on a side of the capacitor structure 200 away from the substrate 100, one of a source 302a and a drain 302c of the transistor structure 300 is electrically connected to the capacitor structure 200, a gate of the transistor structure 300 is electrically connected to the word line 500, and other one of the source 302a and the drain 302c of the transistor structure 300 is electrically connected to the bit line 400.

It should be noted that the semiconductor structure provided by the embodiments of the present disclosure may be a memory device or a non-memory device. The memory device may include, for example, dynamic random access memory (DRAM), static random access memory (SRAM), flash memory, electrically erasable programmable read-only memory (EEPROM), phase change random access memory (PRAM) or magnetoresistive random access memory (MRAM). The non-memory device may be a logic device (e.g., microprocessors, digital signal processors, or microcontrollers) or similar devices. In the embodiments of the present disclosure, a DRAM memory device is taken as an example for description.

In the embodiments of the present disclosure, the gate of the transistor structure 300 is connected to the word line (WL) 500, the drain 302c of the transistor structure 300 is connected to the bit line (BL) 400, and the source 302a of the transistor structure 300 is connected to the capacitor structure 200. The word line 500 is connected to a word line driver, and the word line driver inputs a voltage signal to the word line 500. The word line 500 may also be directly used as the gate of the transistor structure 300, and the voltage signal of the word line 500 can control on or off of the transistor structure 300, and then data information stored in the capacitor structure 200 is read through the bit line 400, or the data information is written into the capacitor structure 200 for storage through the bit line 400. In this way, the function of storing the data information is implemented for the semiconductor structure.

Referring to FIG. 1, an embodiment of the present disclosure provides a plurality of word lines 500 and a plurality of bit lines 400. The plurality of word lines 500 are arranged in parallel and extend along a first direction L1. The plurality of word lines 500 are arranged at intervals along a second direction L2. The plurality of bit lines 400 are arranged in parallel and extend along the second direction L2. The plurality of bit lines 400 are arranged at intervals along the first direction L1. The first direction L1 and the second direction L2 intersect with each other. In this embodiment, an angle between the first direction L1 and the second direction L2 may be a right angle, which is not limited in this embodiment.

Sections along four positions a-a', b-b', c-c' and d-d' in FIG. 1 show structures in FIGS. 2 to 6 and FIGS. 7 to 10, respectively. The substrate 100 in the embodiments of the present disclosure may provide a structural basis for subsequent structures and processes, where the substrate 100 may include the semiconductor layer and the spacer 102. A material of the semiconductor layer may include any one or more of Si, Ge, SiGe, and SiC. In this embodiment, the substrate 100 is a Si substrate.

The spacer 102 may be an electrical insulating layer, and can electrically isolate the capacitor structure 200 from at least part of the semiconductor layer. The spacer 102 may be an oxide layer, such as any one or more of $SiO_x$, $GeO_x$, and $SiGeO_x$. The spacer 102 is arranged between the capacitor structure 200 and at least part of the semiconductor layer, which can effectively prevent the semiconductor layer from having a negative effect on the capacitor structure 200, thereby preventing electrical coupling between the capacitor structure 200 and the semiconductor layer. In this way, the problem of electrical leakage at a contact part between the capacitor structure 200 and the substrate 100 may be alleviated, the stability of the capacitor structure 200 may be improved, and thus the storage performance of the semiconductor structure may be optimized.

With reference to FIGS. 2 to 6, in an embodiment of a first type of substrate 100 of the present disclosure, the substrate 100 includes a first semiconductor layer 101 and a second semiconductor layer 103, where the second semiconductor layer 103 is stacked on the first semiconductor layer 103, the spacer 102 is positioned between the first semiconductor layer 101 and the second semiconductor layer 103, and the capacitor structure 200 is in contact with the second semiconductor layer 103. In this embodiment, the first semiconductor layer 101 may be provided with a signal line of the semiconductor structure, while the second semiconductor layer 103 may be not provided with the signal line, and only serve as the structural basis of the capacitor structure 200. Therefore, compared with the second semiconductor layer 103, the signal line provided in the first semiconductor layer 101 has a greater impact on the capacitor structure 200. On this basis, the spacer 102 is positioned between the first semiconductor layer 101 and the capacitor structure 200, which may effectively prevent the electrical coupling between the capacitor structure 200 and the first semiconductor layer 101, thereby improving the structural stability of the capacitor structure 200.

With reference to FIGS. 7 to 10, in an embodiment of a second type of substrate 100 of the present disclosure, the substrate 100 includes the first semiconductor layer 101, the spacer 102 is provided between the first semiconductor layer 101 and the capacitor structure 200, and the capacitor structure 200 is in contact with the spacer 102. In this embodiment, only one layer of semiconductor layer is provided, i.e., the first semiconductor layer 101. In this way, a thickness of the semiconductor layer may be effectively reduced, which is beneficial to improve an integration level of the semiconductor structure. A signal line may be arranged in the first semiconductor layer 101. Therefore, the spacer 102 is positioned between the capacitor structure 200 and the first semiconductor layer 101, which may effectively prevent the electrical coupling between the capacitor structure 200 and the first semiconductor layer 101, and thus improving the structural stability of the capacitor structure 200.

In this embodiment, the capacitor structure 200 includes a plurality of capacitors 201, and the plurality of capacitors 201 are arranged in an array. Each of the capacitors 201 may include a first electrode 202, a dielectric layer 203, and a second electrode 204, where the dielectric layer 203 is positioned between the first electrode 202 and the second electrode 204. The first electrode 202 or the second electrode 204 between two adjacent capacitors 201 may be used as a common electrode, which can effectively reduce installation space occupied by the capacitor structure 200 and thus improve the integration level of the capacitor structure 200.

As an achievable embodiment, a material of the first electrode 202 and a material of the second electrode 204 include a combination of one or more of N—Si, P—Si, Ru, $RuO_2$, and TiN. A material of the dielectric layer 203 includes a combination of one or more of $Al_2O_3$, ZrO, $HfO_2$, $SrTiO_3$, and $BaTiO_3$. The dielectric layer 203 may be made of a material having a high dielectric constant, to solve the problem of electrical leakage of the dielectric layer 203 and further ensure the stability of the capacitor structure 200.

In this embodiment, the transistor structure 300 includes a plurality of transistors 301 arranged in an array, where the plurality of transistors 301 and the plurality of capacitors 201 are arranged in one-to-one correspondence. Referring to FIG. 2, FIG. 4, FIG. 7 and FIG. 9, the transistors 301 and the capacitors 201 are arranged in one-to-one correspondence, this may be understood that the first electrode 202 of one capacitor 201 and the source 302a of one transistor 301 are in corresponding contact and are electrically conducted, to implement electrical connection between the transistor 301 and the capacitor 201. In some embodiments, it also may be feasible that the second electrode 204 of one capacitor 201 and the source 302a of one transistor 301 are in corresponding contact and are electrically conducted.

In some embodiments, the transistor 301 includes a gate and a semiconductor pillar 302 extending along a vertical direction. In a direction upward from the substrate 100, the semiconductor pillar 302 sequentially includes a source 302a, a channel 302b, and a drain 302c. The gate has an annular structure and surrounds a periphery of the channel 302b. The transistor 301 in this embodiment is a vertical type transistor 301, which may effectively reduce the installation space occupied by the transistor structure 300 and thus effectively improve the integration level of the transistor structure 300. In addition, the gate of the transistor structure 300 is an annular structure surrounding the periphery of the channel 302b to form a gate-all-around (GAA) structure, which can effectively improve gate control capability of the transistor structure 300. In some embodiments, in the semiconductor pillar 302 of the transistor 301, the drain 302c may also be positioned below the source 302a, the drain 302c is electrically connected to the first electrode 202 of the capacitor structure 200, and the source 302a is electrically connected to the bit line 400, which is not limited in this embodiment.

The word line 500 surrounds a periphery of the gate of the transistor structure 300, and the bit line 400 is arranged on a side of the transistor structure 300 away from the substrate 100. It should be noted that both the word lines 500 and the bit lines 400 may be made of metal materials, including but not limited to W and Cu, to reduce resistances of the bit lines 400 and of the bit lines 500. The word lines 500 surround the periphery of the gate of the transistor structure 300, which may effectively reduce difficulty of connection between the word lines 500 and the gate. The bit lines 400 are arranged on a side of the transistor structure 300 away from the substrate 100, which can reduce difficulty of arrangement of the bit lines 400, and facilitate connection between the bit lines 400 and an external bit line 400 driver, thus leading signals out of the bit lines 400, which is more in line with circuit structure design in the semiconductor structure.

Figure 11:
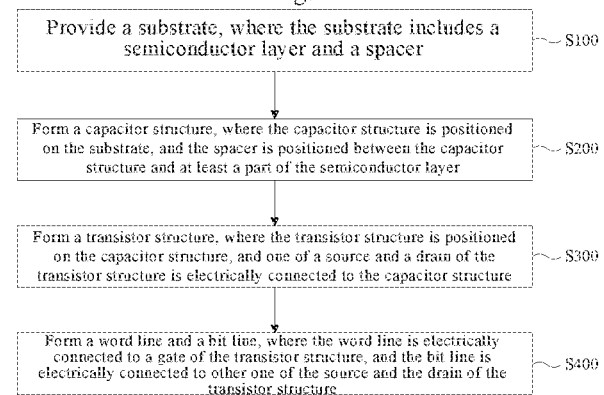
FIG. 11 is a schematic flow diagram of a method for fabricating a semiconductor structure according to an embodiment of the present disclosure.

On the basis of the above embodiments, in a second aspect, referring to FIG. 11, the present disclosure provides a method for fabricating a semiconductor structure, including:

S100: providing a substrate, where the substrate comprises a semiconductor layer and a spacer.

Figure 12:
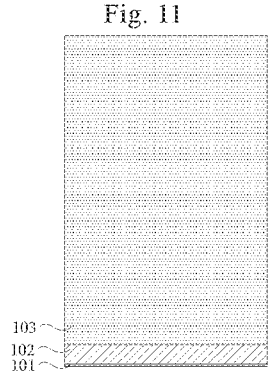
FIG. 12 is a schematic structural diagram of a semiconductor structure provided with a substrate according to an embodiment of the present disclosure.

With reference to FIG. 12, in the embodiment where the first type of substrate 100 is provided, the semiconductor layer includes a first semiconductor layer 101 and a second semiconductor layer 103. The step of providing the substrate 100 may include:

forming the first semiconductor layer 101;

forming a spacer 102 positioned on the first semiconductor layer 101; and forming the second semiconductor layer 103 positioned on the spacer 102.

It should be noted that the first semiconductor layer 101 may serve as a structural basis of the spacer 102 and the second semiconductor layer 103, and a signal line of the semiconductor structure may be arranged in the first semiconductor layer 101. The second semiconductor layer 103 is positioned on the spacer 102, and may serve as a structural basis for the subsequent capacitor structure 200, and the signal line may be not provided in the second semiconductor layer 103. Therefore, compared with the second semiconductor structure, the first semiconductor layer 101 has a greater influence on the electrical coupling of the capacitor structure 200. Arranging the spacer 102 between the capacitor structure 200 and the first semiconductor layer 101 to form the substrate 100 having a silicon on insulator (SOI) structure can effectively alleviate the adverse influence of the first semiconductor layer 101 on the capacitor structure 200, thereby reducing the problem of electrical leakage of the capacitor structure 200.

A material of the first semiconductor layer 101 and a material of the second semiconductor layer 103 may include any one or more of Si, Ge, SiGe, and SiC. The spacer 102 may be an electrical insulating layer, and can electrically isolate the capacitor structure 200 from at least part of the semiconductor layer. The spacer 102 may be an oxide layer, such as any one or more of $SiO_x$, $GeO_x$, and $SiGeO_x$. The spacer 102 and the second semiconductor layer 103 may be formed on the first semiconductor layer 101 by means of deposition. Of course, the spacer 102 may also be formed by oxidizing a part of the first semiconductor layer 101.

It should be noted that in the step of providing the substrate 100, the structures along the four sections a-a', b-b', c-c' and d-d' in FIG. 1 may all be the structures as shown in FIG. 12.

Figure 16:
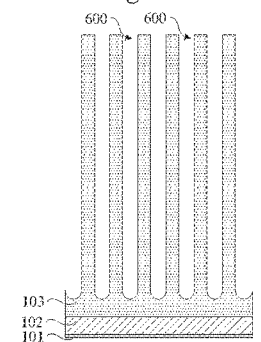
FIG. 16 is a schematic structural diagram of a semiconductor structure with trenches formed according to an embodiment of the present disclosure.
Figure 17:
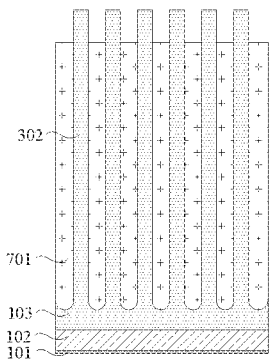
FIG. 17 is a schematic structural diagram of a semiconductor structure with a precursor layer formed according to an embodiment of the present disclosure.
Figure 18:
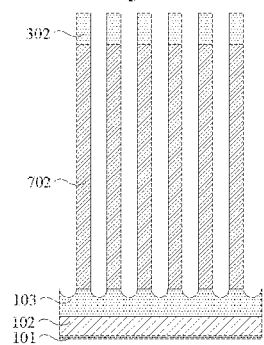
FIG. 18 is a schematic structural diagram of a semiconductor structure with a conductive segment formed according to an embodiment of the present disclosure.

Referring to FIG. 13 to FIG. 16, after the second semiconductor layer 103 is formed, the method further includes:

forming a plurality of trenches 600 in the second semiconductor layer 103, where the plurality of trenches 600 are arranged in an array, and the second semiconductor layer 03 positioned between adjacent two trenches 600 forms the semiconductor pillar 302. The structure of the semiconductor pillar 302 may be as shown in FIG. 16.

In some embodiments, forming the plurality of trenches 600 includes:

forming a plurality of first sub trenches 601 extending along a first direction L1 in the second semiconductor layer 103, where the plurality of first sub trenches 601 are arranged at intervals in parallel; and forming a plurality of second sub trenches 602 extending along a second direction L2 in the second semiconductor layer 103, where the plurality of second sub trenches 602 are arranged at intervals in parallel. The first direction L1 and the second direction L2 intersect with each other. Similar to the above embodiment, the first direction L1 and the second direction L2 may be perpendicular to each other.

Figure 13:
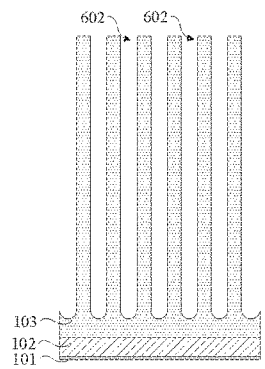
FIG. 13 is a schematic structural diagram of a semiconductor structure with second sub trenches formed according to an embodiment of the present disclosure.

Referring to FIG. 13, in this embodiment, a second sub trench 602 may be formed first by means of etching. In this step, the second sub trench 602 can only be seen along sections c-c' and d-d', the structure along the section a-a' is the same as that shown in FIG. 12, the structure along the section b-b' only includes the first semiconductor layer 101, the spacer 102 and the second semiconductor layer 103, and a top surface of the second semiconductor layer 103 is flush with a trench bottom of the second sub trench 602.

Figure 14:
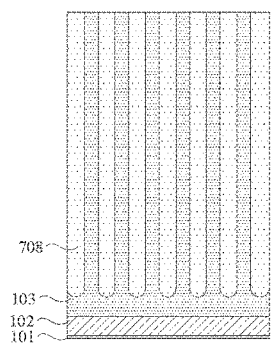
FIG. 14 is a schematic structural diagram of a semiconductor structure with a sacrificial dielectric layer formed according to an embodiment of the present disclosure.

Referring to FIG. 14, after the second sub trench 602 is formed, a sacrificial dielectric layer 708 may be filled in the second sub trench 602, and FIG. 14 shows the structures along two sections c-c' and d-d' after the sacrificial dielectric layer 708 is filled. The structure along the section a-a' after filling the sacrificial dielectric layer 708 is the same as that shown in FIG. 12, and the structure along the section b-b' after filling the sacrificial dielectric layer 708 includes the first semiconductor layer 101, the spacer 102, the second semiconductor layer 103 and the sacrificial dielectric layer 708, where the sacrificial dielectric layer 708 is positioned on the second semiconductor layer 103. The sacrificial dielectric layer 708 may be formed by means of deposition. As shown in FIG. 14, a top surface of the sacrificial dielectric layer 708 is flush with that of a remaining part of the second semiconductor layer 103. A material of the sacrificial dielectric layer 708 may be an oxide, including but not limited to, silicon oxide.

Figure 15:
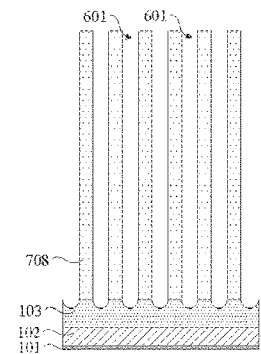
FIG. 15 is a schematic structural diagram of a semiconductor structure with first sub trenches formed according to an embodiment of the present disclosure.

Referring to FIG. 15, a first sub trench 601 is formed by etching in the second semiconductor layer 103 and the sacrificial dielectric layer 708, respectively. FIG. 15 shows the structure along the section b-b' after the first sub trench 601 is formed. The structure along the section a-a' is the same as that shown in FIG. 13. The structure along the section c-c' is the same as that shown in FIG. 14. The structure along the section d-d' only includes the first semiconductor layer 101, the spacer 102 and the second semiconductor layer 103, and the top surface of the second semiconductor layer 103 is flush with the trench bottom of the first sub trench 601. In this embodiment, the trench bottom of the first sub trench 601 is flush with the trench bottom of the second sub trench 602.

After the first sub trench 601 and the second sub trench 602 are formed, the sacrificial dielectric layer 708 is removed to form the structure as shown in FIG. 16. FIG. 16 shows the structures along the two sections a-a' and c-c', and the structures along the two sections b-b' and d-d' only include the first semiconductor layer 101, the spacer 102 and the second semiconductor layer 103, and the top surface of the second semiconductor layer 103 is flush with the trench bottom of the trench 600.

Figure 33:
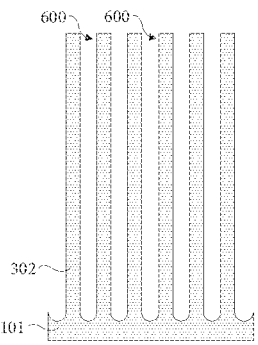
FIG. 33 is a schematic structural diagram of another semiconductor structure with trenches formed according to an embodiment of the present disclosure.

As shown in FIG. 33, in the embodiment where the second type of substrate 100 is provided, the semiconductor layer includes the first semiconductor layer 101. In this embodiment, only the first semiconductor layer 101 is included, and a signal line may be arranged in the first semiconductor layer 101. The first semiconductor layer 101 may be isolated from the capacitor structure 200 by means the spacer 102 formed subsequently, to reduce leakage current of the capacitor structure 200.

On this basis, the providing the substrate 100 may include: forming a plurality of trenches 600 in the first semiconductor layer 101, where the plurality of trenches 600 are arranged in an array, and the first semiconductor layer positioned between two adjacent trenches 600 101 forms the semiconductor pillar 302.

In some embodiments, forming the plurality of trenches 600 includes:

forming a plurality of first sub trenches 601 extending along the first direction L1 in the first semiconductor layer 101, where the plurality of first sub trenches 601 are arranged at intervals in parallel; and forming a plurality of second sub trenches 602 extending along a second direction L2 in the first semiconductor layer 101, where the plurality of second sub trenches 602 are arranged at intervals in parallel. The first direction L1 and the second direction L2 intersect with each other.

Figure 29:
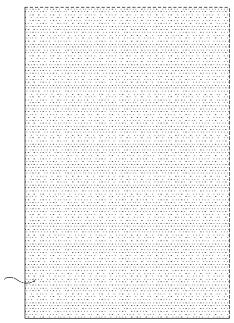
FIG. 29 is a schematic structural diagram of another semiconductor structure provided with a substrate according to an embodiment of the present disclosure.
Figure 30:
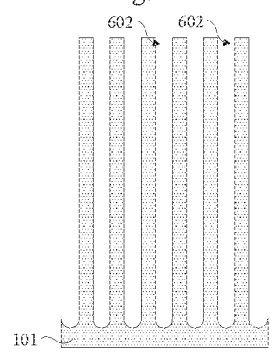
FIG. 30 is a schematic structural diagram of another semiconductor structure with second sub trenches formed according to an embodiment of the present disclosure.

Referring to FIG. 30, in this embodiment, the second sub trench 602 may be formed first by means of etching. FIG. 30 only shows the structures along the two sections c-c' and d-d' after the second sub trench 602 is formed. The structure along the section a-a' is the same as that shown in FIG. 29, the structure along the section b-b' only includes the first semiconductor layer 101, and the top surface of the first semiconductor layer 101 is flush with the trench bottom of the second sub trench 602.

Figure 31:
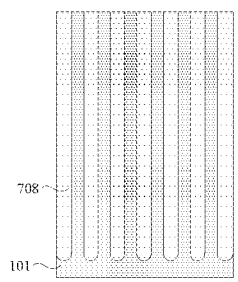
FIG. 31 is a schematic structural diagram of another semiconductor structure with a sacrificial dielectric layer formed according to an embodiment of the present disclosure.

Referring to FIG. 31, after the second sub trench 602 is formed, a sacrificial dielectric layer 708 may be filled in the second sub trench 602, and FIG. 31 shows the structures along two sections c-c' and d-d' after the sacrificial dielectric layer 708 is filled. The structure along the section a-a' after filling the sacrificial dielectric layer 708 is the same as that shown in FIG. 12, and the structure along the section b-b' after filling the sacrificial dielectric layer 708 includes the first semiconductor layer 101 and the sacrificial dielectric layer 708, where the sacrificial dielectric layer 708 is positioned on the first semiconductor layer 101. The sacrificial dielectric layer 708 may be formed by means of deposition. As shown in FIG. 31, a top surface of the sacrificial dielectric layer 708 is flush with the top surface of a reserved part of the first semiconductor layer 101. A material of the sacrificial dielectric layer 708 may be an oxide, including but not limited to, silicon oxide.

Figure 32:
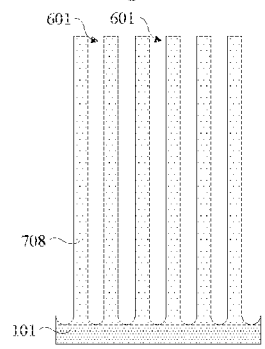
FIG. 32 is a schematic structural diagram of another semiconductor structure with first sub trenches formed according to an embodiment of the present disclosure.

Referring to FIG. 32, the first sub trench 601 is formed by etching in the first semiconductor layer 101 and the sacrificial dielectric layer 708. FIG. 32 shows the structure along the section b-b' after the first sub trench 601 is formed. The structure along the section a-a' is the same as that shown in FIG. 30. The structure along the section c-c' is the same as that shown in FIG. 31. The structure along the section d-d' only includes the first semiconductor layer 101, and the top surface of the first semiconductor layer 101 is flush with the trench bottom of the first sub trench 601. In this embodiment, the trench bottom of the first sub trench 601 is flush with the trench bottom of the second sub trench 602.

After the first sub trench 601 and the second sub trench 602 are formed, the sacrificial dielectric layer 708 is removed to form the structure as shown in FIG. 33. FIG. 33 shows the structures along the two sections a-a' and c-c', and the structures along the two sections b-b' and d-d' only include the first semiconductor layer 101, and the top surface of the first semiconductor layer 101 is flush with the trench bottom of the trench 600.

After forming the trenches 600, the method further includes: forming a spacer 102, where the spacer 102 is positioned at the trench bottoms of the trenches 600 and is communicated with the plurality of trenches 600.

Figure 34:
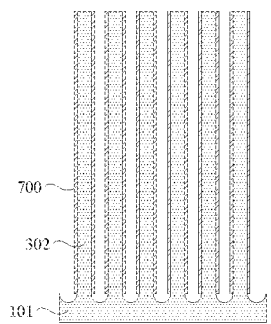
FIG. 34 is a schematic structural diagram of another semiconductor structure with a sacrificial layer formed according to an embodiment of the present disclosure.

In some embodiments, referring to FIG. 34, before etching the trench bottoms of the trenches 600, the method further includes: forming a sacrificial layer 700 on a side wall of the semiconductor pillar 302. The sacrificial layer 700 may be formed by means of deposition. After the deposition, only the sacrificial layer 700 positioned on the side wall of the semiconductor may be retained by means of an etch-back process. A material of the sacrificial layer 700 may be Ni or C.

Figure 35:
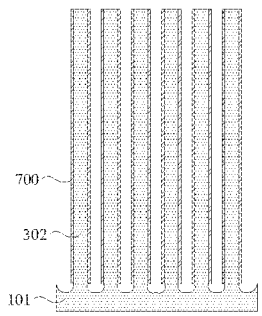
FIG. 35 is a schematic structural diagram of another semiconductor structure with a bowl-shaped structure formed according to an embodiment of the present disclosure.

As shown in FIG. 35, forming the spacer 102 includes: removing part of the first semiconductor layer 101 at the trench bottom of the trench 600 by means of etching to form a bowl-shaped structure at the bottom of the trench bottom. The etching in this step may be completed by means of wet etching, and a part of the first semiconductor layer 101 positioned at the trench bottom of the trench 600 is selectively removed, such that a space at the trench bottom of the trench 600 is increased, and a trench wall between adjacent trenches 600 is thinned.

Figure 36:
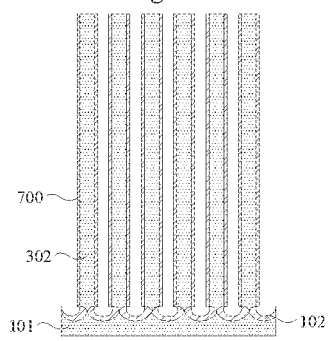
FIG. 36 is a schematic structural diagram of another semiconductor structure with a spacer formed according to an embodiment of the present disclosure.
Figure 37:
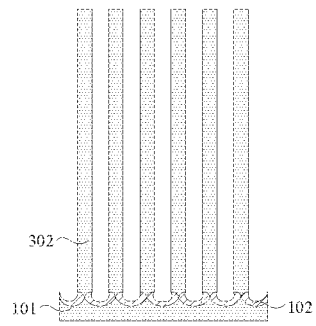
FIG. 37 is a schematic structural diagram of another semiconductor structure with the sacrificial layer removed according to an embodiment of the present disclosure.
Figure 38:
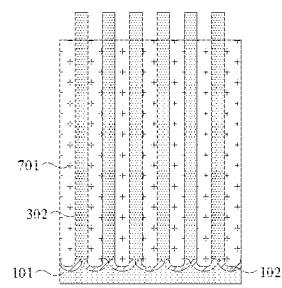
FIG. 38 is a schematic structural diagram of another semiconductor structure with a precursor layer formed according to an embodiment of the present disclosure.
Figure 39:
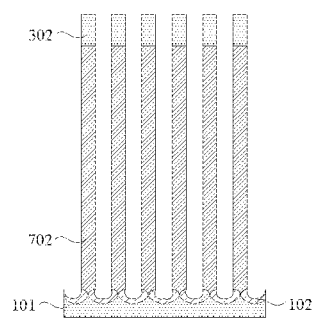
FIG. 39 is a schematic structural diagram of another semiconductor structure with a conductive segment formed according to an embodiment of the present disclosure.

With reference to FIGS. 36 and 37, after the bowl-shaped structure is formed, a part of the first semiconductor layer 101 at the trench bottom is oxidized to form a first oxide layer, and the first semiconductor layer 101 at the bottom of the semiconductor pillar 302 is completely oxidized to form a second oxide layer. The first oxide layer and the second oxide layer are integrally connected to form the spacer 102. It should be explained that during the oxidation, because the trench wall between adjacent trenches 600 has been thinned, not only the first semiconductor layer 101 positioned at the trench bottom of the trench 600 is completely oxidized into the first oxide layer, but also the first semiconductor layer 101 positioned at the bottom of the semiconductor pillar 302 is also completely oxidized to form the second oxide layer. Forming the spacer 102 by means of oxidation in the above manner may effectively reduce the difficulty of forming the spacer 102, and process parameters of the oxidation process may be controlled to achieve the purpose of adjusting the thickness of the spacer 102, thereby improving controllability in the fabrication process of the spacer 102.

Further, after the spacer 102 is formed, the sacrificial layer 700 is removed. The removal of the sacrificial layer 700 may be accomplished by means of wet etching.

In the above two embodiments, the second sub trench 602 is formed first, and then the first sub trench 601 is formed. In some other embodiments, the first sub trench 601 may also be formed first, and then the second sub trench 602 is formed. This embodiment does not limit the order of forming the first sub trench 601 and the second sub trench 602.

Referring to FIG. 11, after forming the substrate 100 having the spacer 102, the method may further include:

S200: forming a capacitor structure, where the capacitor structure is positioned on the substrate, and the spacer is positioned between the capacitor structure and at least a part of the semiconductor layer.

In some embodiments, forming the capacitor structure 200 includes:

forming a precursor layer 701, where the precursor layer 701 is positioned in the trenches 600, and a top surface of the precursor layer 701 is lower than that of the semiconductor pillar 302; and processing the precursor layer 701 and the semiconductor pillar 302, and forming a conductive segment 702 in an overlap part between the semiconductor pillar 302 and the precursor layer 701.

As shown in FIG. 17, FIG. 18, FIG. 38 and FIG. 39, the precursor layer 701 may be formed in the trench 600 by means of deposition, and a material of the precursor layer 701 may include phosphorus silicon glass (PSG). The precursor layer 701 and the semiconductor pillar 302 may be treated by means of heat treatment, and P elements may diffuse into Si of the semiconductor pillar 302 during the heat treatment, thereby forming a P-doped Si pillar, such that the semiconductor pillar 302 is conductive, to form the conductive segment 702. The "overlap part" between the semiconductor pillar 302 and the precursor layer 701 may be understood as a part where the semiconductor pillar 302 is in contact with the precursor layer 701.

Figure 19:
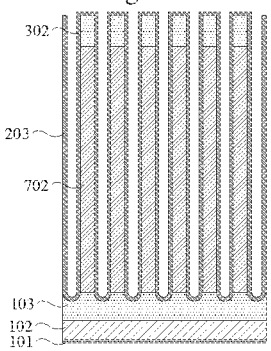
FIG. 19 is a schematic structural diagram of a semiconductor structure with a dielectric layer formed according to an embodiment of the present disclosure.
Figure 20:
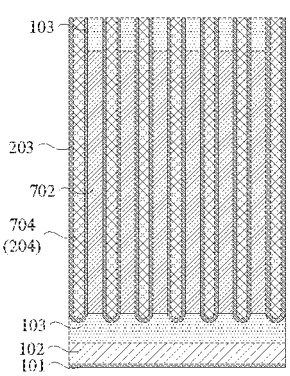
FIG. 20 is a schematic structural diagram of a semiconductor structure with a second conductive layer formed according to an embodiment of the present disclosure.

As an achievable embodiment, the conductive segment 702 forms the first electrode 202 of the capacitor structure 200. With reference to FIG. 19 and FIG. 20, in the capacitor structure 200, the conductive segment 702 is the first electrode 202 of the capacitor structure 200. This way of forming the first electrode 202 is relatively simple in fabrication processes.

As another achievable embodiment, after forming the conductive segment 702, the method further includes:

forming a first conductive layer 703, where the first conductive layer 703 is positioned in the trenches 600 and covers a side wall of the conductive segment 702, the conductive segment 702 is electrically connected to the first conductive layer 703. The first conductive layer 703 forms the first electrode 202 of the capacitor structure 200, thereby forming the first electrode 202 having the conductive on conductive (COC) structure.

Figure 40:
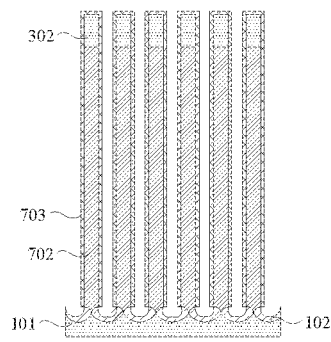
FIG. 40 is a schematic structural diagram of another semiconductor structure with a first conductive layer formed according to an embodiment of the present disclosure.

As shown in FIG. 40, the first conductive layer 703 may be formed in the trench 600 by means of deposition, and then only the first conductive layer 703 positioned on a side wall of the conductive segment 702 and a side wall of the semiconductor pillar 302 is retained by means of an etching-back process. The first conductive layer 703 is electrically connected to the conductive segment 702, and the first conductive layer 703 may serve as the first electrode 202. The first conductive layer 703 may be made of a metal material, which includes, but is not limited to, Ru and TiN. In this way, conductivity of the first electrode 202 may be improved, and the storage capability of the capacitor structure 200 may be improved.

Figure 41:
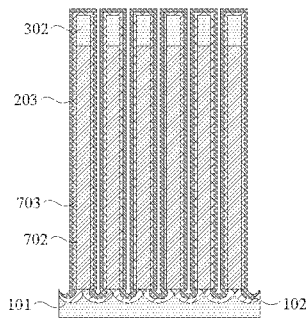
FIG. 41 is a schematic structural diagram of another semiconductor structure with a dielectric layer formed according to an embodiment of the present disclosure.

After forming the first electrode 202 of the capacitor structure 200, the method further includes:

forming a dielectric layer 203, where the dielectric layer 203 is positioned in the trenches 600 and covers a side wall of the first electrode 202. It should be noted that as shown in FIG. 19, in the embodiment where the conductive segment 702 is used as the first electrode 202, the dielectric layer 203 may cover the side wall of the first electrode 202, and may simultaneously cover the side wall and a top wall of the semiconductor pillar 302 and the trench bottom of the trench 600. Referring to FIG. 41, in the embodiment where the first conductive layer 703 is used as the first electrode 202, the dielectric layer 203 may also cover the top wall of the first electrode 202 and the surface of the spacer 102 at the trench bottom of the trench 600.

After forming the dielectric layer 203, the method may further include: forming a second conductive layer 704, where the second conductive layer 704 is positioned in the trenches 600 and covers a side wall of the dielectric layer 203, and the second conductive layer 704 forms the second electrode 204 of the capacitor structure 200. It should be noted that with reference to FIG. 20 and FIG. 42, the second conductive layer 704 may be formed by means of deposition.

Figure 42:
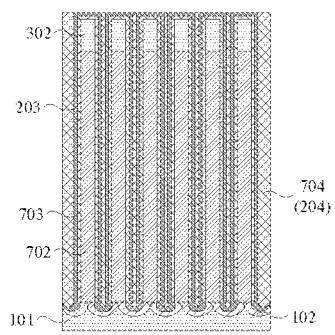
FIG. 42 is a schematic structural diagram of another semiconductor structure with a second conductive layer formed according to an embodiment of the present disclosure.

As an achievable embodiment, the top surface of the dielectric layer 203, the top surface of the first conductive layer 703 and the top surface of the second conductive layer 704 are all flush with the top surface of the semiconductor pillar 302. It should be noted that, referring to FIG. 20, both the top surface of the dielectric layer 203 and the top surface of the second conductive layer 704 are all flush with the top surface of the semiconductor pillar 302. On the basis of the structure as shown in FIG. 42, the first conductive layer 703, the dielectric layer 203 and the second conductive layer 704 above the top surface of the semiconductor pillar 302 may be removed by means of etching. In this way, a subsequent transistor structure 300 may be conveniently fabricated. Of course, during the fabrication, the etching process of this step and the subsequent process of exposing the semiconductor pillar 302 may also be combined to reduce the process steps.

Figure 21:
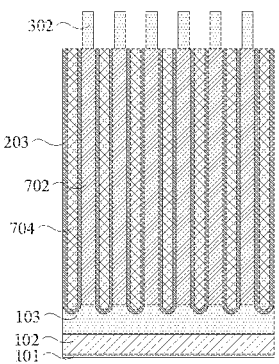
FIG. 21 is a schematic structural diagram of a semiconductor structure with semiconductor pillars exposed according to an embodiment of the present disclosure.
Figure 43:
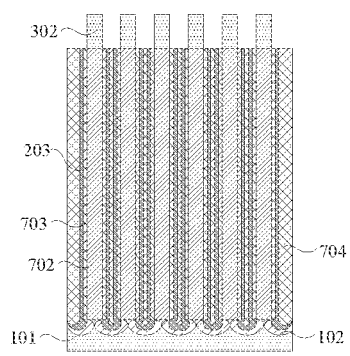
FIG. 43 is a schematic structural diagram of another semiconductor structure with semiconductor pillars exposed according to an embodiment of the present disclosure.

After forming the second electrode 204 of the capacitor structure 200 and before forming the transistor structure 300, the method further includes:

etching back to remove a part of the dielectric layer 203, a part of the first conductive layer 703, and a part of the second conductive layer 704, to expose a part of the semiconductor pillar 302 other than the conductive segment 702. It should be noted that, referring to FIG. 21 and FIG. 43, exposing a part of the semiconductor pillar 302 other than the conductive segment 702 may expose the semiconductor pillar 302 for fabricating the transistor structure 300, to form the source 302a, the channel 302b and the drain 302c of the transistor structure 300.

The top surface of the reserved part of the dielectric layer 203, the top surface of the reserved part of the first conductive layer 703 and the top surface of the reserved part of the second conductive layer 704 are all flush with the top surface of the conductive segment 702. In this way, structural regularity of the semiconductor structure can be improved.

With reference to FIG. 11, after forming the capacitor structure 200, the method may further include S300: forming a transistor structure 300, where the transistor structure 300 is positioned on the capacitor structure 200, and a source 302a of the transistor structure 300 is electrically connected to the capacitor structure 200. In some embodiments, forming the transistor structure 300 includes:

forming a source 302a, a channel 302b and a drain 302c of the transistor structure 300 in a part of the semiconductor pillar 302 other than the conductive segment 702, where in a direction upward from the substrate 100, the source 302a, the channel 302b and the drain 302c are arranged in sequence, and the source 302a is electrically connected to the conductive segment 702; and forming a gate, where the gate surrounds a periphery of the channel 302b.

It should be noted that, in this embodiment, the source 302a is positioned below the channel 302b, and the drain 302c is positioned above the channel 302b. In other embodiments, the drain 302c may be positioned below the channel 302b, and the source 302a may be positioned above the channel 302b. The gate is not shown in the figure, but the gate surrounds the periphery of the channel 302b, which may form a gate-all-around (GAA) structure, to improve gate control capability of the transistor structure 300.

With continued reference to FIG. FIG. 11, after forming the transistor structure 300, the method may further include S400: forming a word line 500 and a bit line 400, where the word line 500 is electrically connected to the gate of the transistor structure 300, and the bit line 400 is electrically connected to the drain 302c of the transistor structure 300.

In some embodiments, forming the word line 500 and the bit line 400 includes: forming a third conductive layer 705, where the third conductive layer 705 surrounds a periphery of the gate and is electrically connected to the gate, and the third conductive layer 705 forms the word line 500.

Figure 22:
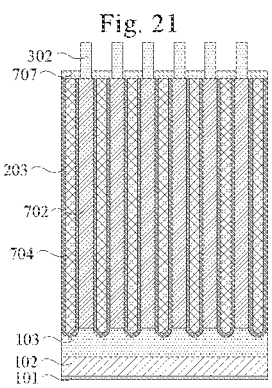
FIG. 22 is a schematic structural diagram of a semiconductor structure with insulating dielectric layers formed according to an embodiment of the present disclosure.
Figure 44:
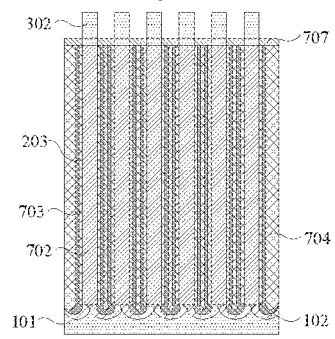
FIG. 44 is a schematic structural diagram of another semiconductor structure with insulating dielectric layers formed according to an embodiment of the present disclosure.
Figure 45:
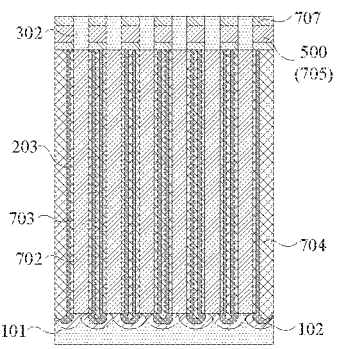
FIG. 45 is a sectional view of another semiconductor structure with word lines formed along the a-a' section according to an embodiment of the present disclosure.
Figure 46:
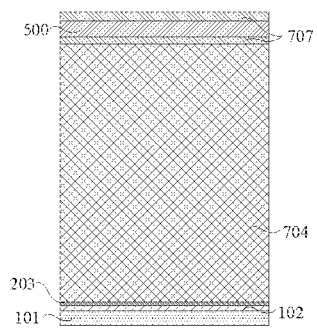
FIG. 46 is a sectional view of another semiconductor structure with word lines formed along the b-b' section according to an embodiment of the present disclosure.

Referring to FIG. 22 and FIG. 44, before forming the third conductive layer 705, the method further includes: forming an insulating dielectric layer 707. The third conductive layer 705 is positioned on the insulating dielectric layer 707, and the insulating dielectric layer 707 herein is configured to isolate the capacitor structure 200 from the word line 500. With reference to FIG. 45 and FIG. 46, after the third conductive layer 705 is formed, and before the fourth conductive layer 706 is formed, the insulating dielectric layer 707 may also be formed. The insulating dielectric layer 707 herein is configured to isolate the word line 500 from the bit line 400. FIG. 45 shows the structure along the c-c' section, and FIG. 46 shows the structure along the d-d' section. The structure along the a-a' section is the same as that in FIG. 49. The structure along the b-b' section is the same as that in FIG. 50.

Figure 23:
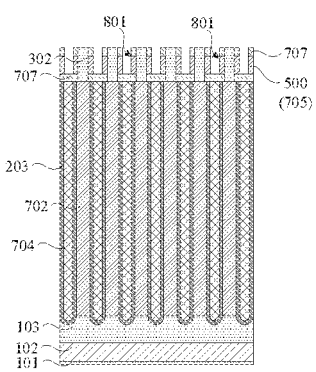
FIG. 23 is a sectional view of a semiconductor structure with word line isolation trenches formed along the a-a section according to an embodiment of the present disclosure.
Figure 24:
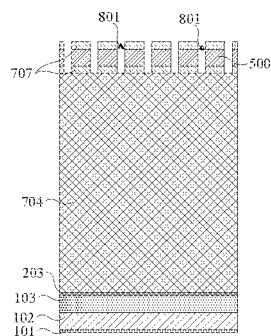
FIG. 24 is a sectional view of a semiconductor structure with word line isolation trenches formed along the b-b' section according to an embodiment of the present disclosure.
Figure 25:
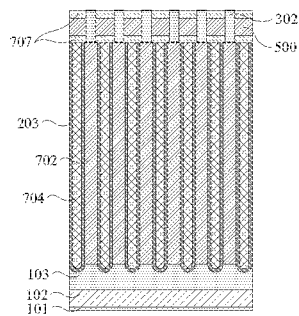
FIG. 25 is a sectional view of a semiconductor structure with word line isolation trenches formed along the c-c' section according to an embodiment of the present disclosure.

In the semiconductor structure having the first type of substrate 100, FIGS. 23 to 25 show a structure where a word line isolation trench 801 is formed after the third conductive layer 705 is formed. FIG. 23 shows the structure along the a-a' section, FIG. 24 shows the structure along the b-b' section, and FIG. 25 shows the structure along the c-c' section.

Figure 26:
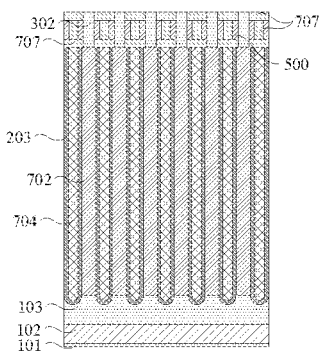
FIG. 26 is a sectional view of a semiconductor structure with an insulating dielectric layer on a word line formed along the a-a section according to an embodiment of the present disclosure.
Figure 27:
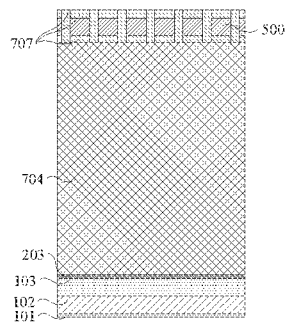
FIG. 27 is a sectional view of a semiconductor structure with an insulating dielectric layer on a word line formed along the b-b' section according to an embodiment of the present disclosure.
Figure 28:
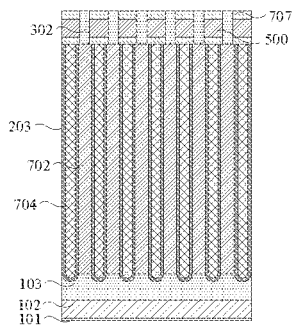
FIG. 28 is a sectional view of a semiconductor structure with an insulating dielectric layer on a word line formed along the c-c' section according to an embodiment of the present disclosure.

FIGS. 26 to 28 show a structure where the insulating dielectric layer 707 is formed in the word line isolation trench 801. The insulating dielectric layer 707 herein is configured to isolate adjacent two word lines 500. FIG. 26 shows the structure along the a-a' section, FIG. 27 shows the structure along the b-b' section, and FIG. 28 shows the structure along the c-c' section.

Figure 47:
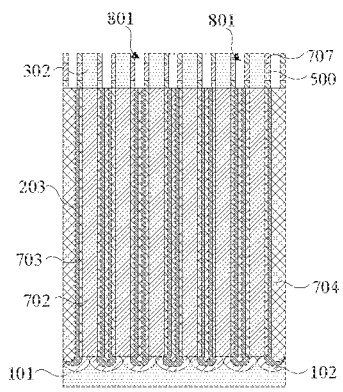
FIG. 47 is a sectional view of another semiconductor structure with word line isolation trenches formed along the a-a' section according to an embodiment of the present disclosure.
Figure 48:
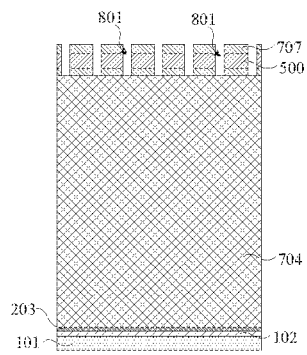
FIG. 48 is a sectional view of another semiconductor structure with word line isolation trenches formed along the b-b' section according to an embodiment of the present disclosure.

Similarly, in the semiconductor structure having the second type of substrate 100, FIG. 47 and FIG. 48 show the structure where the word line isolation trench 801 is formed after the third conductive layer 705 is formed. FIG. 47 shows the structure along the a-a' section, and FIG. 48 shows the structure along the b-b' section. The structure along the c-c' section is the same as that in FIG. 45, and the structure along the d-d' section is the same as that in FIG. 46.

Figure 49:
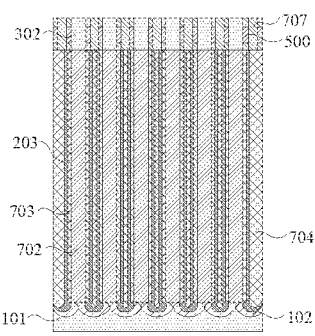
FIG. 49 is a sectional view of another semiconductor structure with an insulating dielectric layer on a word line formed along the a-a' section according to an embodiment of the present disclosure.
Figure 50:
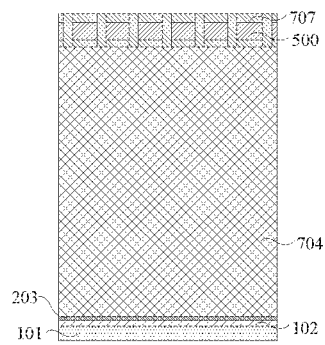
FIG. 50 is a sectional view of another semiconductor structure with an insulating dielectric layer on a word line formed along the b-b' section according to an embodiment of the present disclosure.

FIG. 49 and FIG. 50 show a structure in which the insulating dielectric layer 707 is formed in the word line isolation trench 801. The insulating dielectric layer 707 herein functions to isolate adjacent two of the word lines 500. FIG. 49 shows the structure along the a-a' section, FIG.

50 shows the structure along the b-b' section, the structure along the c-c' section is the same as that in FIG. 45, and the structure along the d-d' section is the same as that in FIG. 46.

After the third conductive layer 705 is formed, the method may further include: forming a fourth conductive layer 706, where the fourth conductive layer 706 is positioned on the third conductive layer 705 and is electrically connected to the drain 302c, and the fourth conductive layer 706 forms the bit line 400.

FIGS. 2 to 4 and FIG. 6 illustrate the structure of the fourth conductive layer 706 in the semiconductor structure having the first type of substrate 100. FIGS. 7 to 10 illustrate the structure of the fourth conductive layer 706 in the semiconductor structure having the second type of substrate 100. The insulating dielectric layer 707 is also provided between adjacent fourth conductive layers 706 to isolate the adjacent fourth conductive layers 706.

In this embodiment, there are a plurality of third conductive layers 705, the plurality of third conductive layers 705 are arranged at intervals in parallel and extend along the first direction L1. In this way, it may be ensured that there are a plurality of word lines 500 formed, and the plurality of word lines 500 are arranged at intervals in parallel and extend along the first direction L1. Similarly, there are a plurality of fourth conductive layer 706, and the plurality of fourth conductive layers 706 are arranged at intervals in parallel and extend along the second direction L2. In this way, it may also be ensured that there are a plurality of bit lines 400 formed, and the plurality of bit lines 400 are arranged at intervals in parallel and extend along the second direction L2.

In the above description, it is to be noted that unless specified or limited otherwise, terms such as "installation", "connecting" or "connection" should be understood in a broad sense, which may be, for example, a fixed connection, an indirect connection by means of an intermediary, an internal communication between two components or an interaction relationship between two components. For those of ordinary skill in the art, concrete meanings of the above terms in the present disclosure may be understood based on concrete circumstances. The orientation or position relations represented by the terms of "above", "below", "front", "back", "vertical", "horizontal", "top", "bottom", "inside", "outside" and the like are orientation or position relations shown based on the accompanying drawings, they are merely for ease of a description of the present disclosure and a simplified description instead of being intended to indicate or imply the apparatus or element to have a special orientation or to be configured and operated in a special orientation. Thus, they cannot be understood as limiting of the present disclosure. In the description of the present disclosure, "a plurality of" means two or more, unless otherwise expressly specified.

In the specification, the claims and the foregoing accompanying drawings of the present disclosure, a term such as "first", "second", "third", or "fourth" (if present) is intended to distinguish between similar objects but is not necessarily intended to describe a particular sequence or precedence order. It is to be understood that data used like this may be interchangeable where appropriate, such that the embodiments of the present disclosure described herein can be implemented in sequences excluding those illustrated or described herein. Furthermore, terms such as "comprise", "have" or other variants thereof are intended to cover a non-exclusive "comprise", for example, processes, methods, systems, products or devices comprising a series of steps or units are not limited to these steps or units listed explicitly, but comprise other steps or units not listed explicitly, or other steps or units inherent to these processes, methods, systems, products or devices.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, which does not make corresponding technical solutions in essence depart from the scope of the technical solutions of the embodiments of the present disclosure.

What is claimed is:

1. A semiconductor structure, comprising a substrate, a capacitor structure, a transistor structure, a bit line and a word line, wherein
   the substrate comprises a semiconductor layer and a spacer;
   the capacitor structure is arranged on the substrate, the spacer being positioned between the capacitor structure and at least a part of the semiconductor layer; and
   the transistor structure and the word line are arranged on a side of the capacitor structure distant from the substrate, one of a source and a drain of the transistor structure being electrically connected to the capacitor structure, a gate of the transistor structure being electrically connected to the word line, and other one of the source and the drain of the transistor structure being electrically connected to the bit line;
   wherein the semiconductor layer comprises a first semiconductor layer, the spacer being arranged between the first semiconductor layer and the capacitor structure, and the capacitor structure being in contact with the spacer.

2. The semiconductor structure according to claim 1, wherein
   the capacitor structure comprises a plurality of capacitors arranged in an array;
   the transistor structure comprises a plurality of transistors arranged in an array, the plurality of transistors and the plurality of capacitors being arranged in one-to-one correspondence.

3. The semiconductor structure according to claim 2, wherein each of the plurality of transistors comprises a gate and a semiconductor pillar extending along a vertical direction; the semiconductor pillar sequentially comprising a source, a channel and a drain along a direction upward from the substrate; the gate being an annular structure and surrounding a periphery of the channel.

4. The semiconductor structure according to claim 1, wherein a plurality of word lines surround a periphery of the gate of the transistor structure, a plurality of bit lines being arranged on a side of the transistor structure away from the substrate.

5. A method for fabricating a semiconductor structure, comprising:
   providing a substrate, the substrate comprising a semiconductor layer and a spacer, the semiconductor layer comprising a first semiconductor layer, wherein the providing the substrate comprises: forming a plurality of trenches in the first semiconductor layer, the plurality of trenches being arranged in an array, and the first semiconductor layer positioned between adjacent two of the plurality of trenches forming a semiconductor pillar; and forming the spacer, the spacer being positioned at trench bottoms of the plurality of trenches and being communicated with the plurality of trenches;

forming a capacitor structure, the capacitor structure being positioned on the substrate, and the spacer being positioned between the capacitor structure and at least a part of the semiconductor layer;

forming a transistor structure, the transistor structure being positioned on the capacitor structure, and one of a source and a drain of the transistor structure being electrically connected to the capacitor structure; and forming a word line and a bit line, the word line being electrically connected to a gate of the transistor structure, and the bit line being electrically connected to other one of the source and the drain of the transistor structure.

6. The method for fabricating a semiconductor structure according to claim 5, wherein the forming the plurality of trenches comprises: forming a plurality of first sub trenches extending along a first direction in the first semiconductor layer, the plurality of first sub trenches being arranged at intervals in parallel; and forming a plurality of second sub trenches extending along a second direction in the first semiconductor layer, the plurality of second sub trenches being arranged at intervals in parallel; wherein the first direction and the second direction intersect with each other.

7. The method for fabricating a semiconductor structure according to claim 5, wherein the forming the spacer comprises: removing a part of the first semiconductor layer positioned at the trench bottoms of the plurality of trenches by etching, to form a bowl-shaped structure at the trench bottoms; and oxidizing a part of the first semiconductor layer at the trench bottoms to form a first oxide layer, the first semiconductor layer at a bottom of the semiconductor pillar being completely oxidized to form a second oxide layer, and the first oxide layer and the second oxide layer being integrally connected to form the spacer.

8. The method for fabricating a semiconductor structure according to claim 5, wherein the forming the capacitor structure comprises:

forming a precursor layer, the precursor layer being positioned in the plurality of trenches, and a top surface of the precursor layer being lower than a top surface of the semiconductor pillar; and processing the precursor layer and the semiconductor pillar, and forming a conductive segment in an overlap part between the semiconductor pillar and the precursor layer;

wherein the conductive segment forms a first electrode of the capacitor structure.

9. The method for fabricating a semiconductor structure according to claim 8, wherein after forming the conductive segment, the method further comprises: forming a first conductive layer, the first conductive layer being positioned in the plurality of trenches and covering a side wall of the conductive segment, the conductive segment being electrically connected to the first conductive layer, and the first conductive layer forming a first electrode of the capacitor structure.

10. The method for fabricating a semiconductor structure according to claim 9, wherein after forming the first electrode of the capacitor structure, the method further comprises: forming a dielectric layer, the dielectric layer being positioned in the plurality of trenches and covering a side wall of the first electrode; and forming a second conductive layer, the second conductive layer being positioned in the plurality of trenches and covering a side wall of the dielectric layer, and the second conductive layer forming a second electrode of the capacitor structure.

11. The method for fabricating a semiconductor structure according to claim 10, wherein a top surface of the dielectric layer, a top surface of the first conductive layer, and a top surface of the second conductive layer are all flush with the top surface of the semiconductor pillar; and after forming the second electrode of the capacitor structure and before forming the transistor structure, the method further comprises:

etching back to remove a part of the dielectric layer, a part of the first conductive layer and a part of the second conductive layer, to expose a part of the semiconductor pillar except the conductive segment; wherein a top surface of a remaining part of the dielectric layer, a top surface of a remaining part of the first conductive layer, and a top surface of a remaining part of the second conductive layer are all flush with a top surface of the conductive segment.

12. The method for fabricating a semiconductor structure according to claim 11, wherein the forming the transistor structure comprises:

forming a source, a channel and a drain of the transistor structure in the part of the semiconductor pillar except the conductive segment; along a direction upward from the substrate, the source, the channel and the drain being arranged in sequence, and the source being electrically connected to the conductive segment; and forming a gate, the gate surrounding a periphery of the channel.

13. The method for fabricating a semiconductor structure according to claim 12, wherein the forming the word line and the bit line comprises:

forming a third conductive layer, the third conductive layer surrounding a periphery of the gate and being electrically connected to the gate, and the third conductive layer forming the word line; and forming a fourth conductive layer, the fourth conductive layer being positioned on the third conductive layer and being electrically connected to the drain, and the fourth conductive layer forming the bit line.

14. The method for fabricating a semiconductor structure according to claim 13, wherein there are a plurality of third conductive layers, the plurality of third conductive layers being arranged at intervals in parallel and extending along a first direction; and there are a plurality of fourth conductive layers, the plurality of fourth conductive layers being arranged at intervals in parallel and extending along a second direction.

15. A semiconductor structure, comprising a substrate, a capacitor structure, a transistor structure, a bit line and a word line, wherein the substrate comprises a semiconductor layer and a spacer;

the capacitor structure is arranged on the substrate, the spacer being positioned between the capacitor structure and at least a part of the semiconductor layer; and the transistor structure and the word line are arranged on a side of the capacitor structure distant from the substrate, one of a source and a drain of the transistor structure being electrically connected to the capacitor structure, a gate of the transistor structure being electrically connected to the word line, and other one of the source and the drain of the transistor structure being electrically connected to the bit line;

wherein the semiconductor layer comprises a first semiconductor layer and a second semiconductor layer, the second semiconductor layer being stacked on the first semiconductor layer, the spacer being positioned between the first semiconductor layer and the second semiconductor layer, and the capacitor structure being in contact with the second semiconductor layer.

16. The semiconductor structure according to claim 15, wherein the capacitor structure comprises a plurality of capacitors arranged in an array;

the transistor structure comprises a plurality of transistors arranged in an array, the plurality of transistors and the plurality of capacitors being arranged in one-to-one correspondence.

17. The semiconductor structure according to claim 16, wherein each of the plurality of transistors comprises a gate and a semiconductor pillar extending along a vertical direction; the semiconductor pillar sequentially comprising a source, a channel and a drain along a direction upward from the substrate; the gate being an annular structure and surrounding a periphery of the channel.

18. The semiconductor structure according to claim 15, wherein a plurality of word lines surround a periphery of the gate of the transistor structure, the plurality of bit lines being arranged on a side of the transistor structure away from the substrate.

* * * * *